United States Patent
Morita et al.

(10) Patent No.: US 6,570,752 B2
(45) Date of Patent: May 27, 2003

(54) WAFER CHUCKS AND THE LIKE INCLUDING SUBSTRATE-ADHESION DETECTION AND ADHESION CORRECTION

(75) Inventors: Kenji Morita, Kawagoe (JP); Tomoharu Fujiwara, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/750,011

(22) Filed: Dec. 27, 2000

(65) Prior Publication Data

US 2001/0005595 A1 Jun. 28, 2001

(30) Foreign Application Priority Data

Dec. 28, 1999 (JP) .............................. 11-373161
Dec. 28, 1999 (JP) .............................. 11-373334
Feb. 24, 2000 (JP) .............................. 2000-047404

(51) Int. Cl.[7] .............................................. H01G 23/00
(52) U.S. Cl. .................................... 361/234; 324/758
(58) Field of Search ...................... 438/14; 324/758; 361/234

(56) References Cited

U.S. PATENT DOCUMENTS 6,075,375 A  * 6/2000 Burkhart et al. ............ 324/758
6,278,600 B1 * 8/2001 Shamouilian et al. ....... 361/234

OTHER PUBLICATIONS

D Kahng, T.A. Shankoff, T.T. Sheng and S.E. Haszko; "A Method for Area Saving Palnar Isolation Oxides Using Oxidation Protected Sidewalls", Nov. 1980, J Electrochem. Soc.: Solid State Sceince and Technology; p. 2468–2471.*

* cited by examiner

Primary Examiner—John F. Niebling
Assistant Examiner—André C Stevenson
(74) Attorney, Agent, or Firm—Klarquist Sparkman LLP

(57) ABSTRACT

Wafer chucks and related substrate-holding devices are disclosed for use in holding the substrate while any of various processes are being performed on the substrate. For example, the devices are useful for holding a semiconductor wafer during microlithography performed on the wafer, especially in a vacuum environment. The wafer chucks can include devices for confirming that the substrate is adhered completely and properly to the "adhesion surface" of the wafer chuck before commencing flow of a heat-transfer gas to the wafer chuck. Such status-confirming devices can be, e.g., height gauges or electrical contacts that measure an electrical property that changes with changes in contact pressure of the contacts against the substrate. The wafer chucks can include devices that compensate for faulty adhesion of the substrate to the wafer chuck, such as devices that change pressures in ducts that supply and remove heat-transfer gas from a channel(s) located in the adhesion surface of the wafer chuck, so as to compensate for increased leak rates of heat-transfer gas into the environment surrounding the wafer chuck.

29 Claims, 5 Drawing Sheets

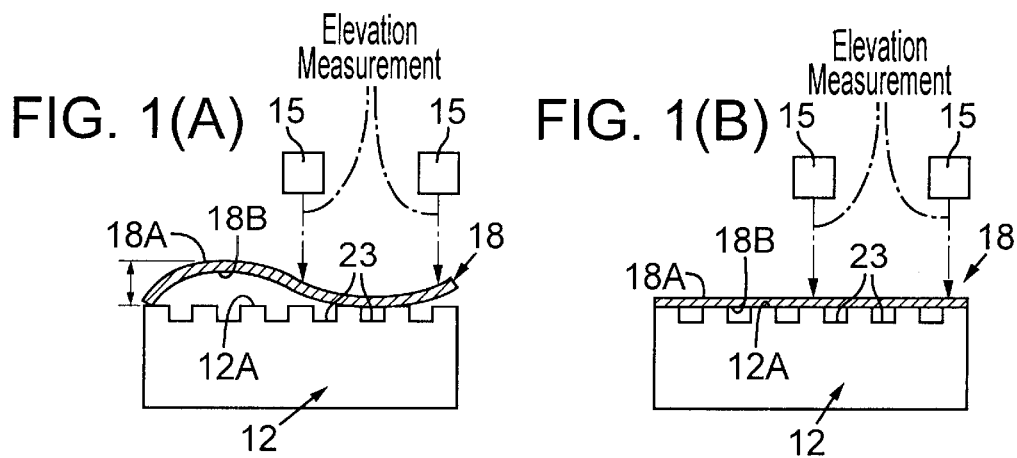
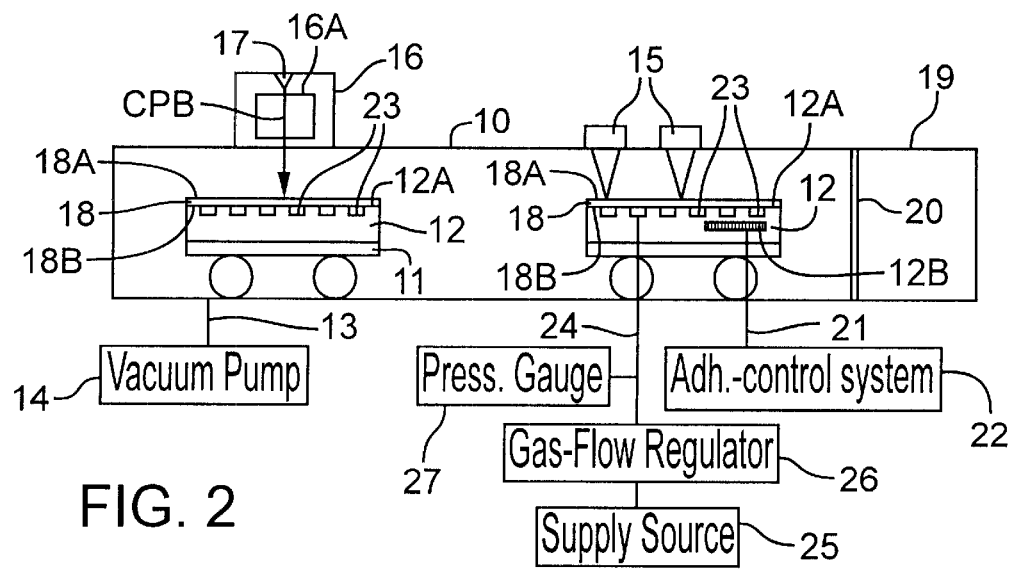
FIG. 2
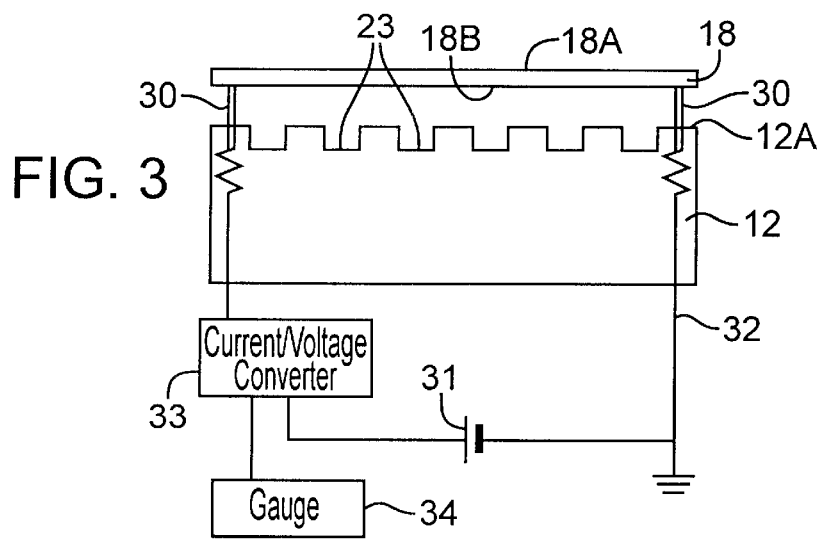
FIG. 3

WAFER CHUCKS AND THE LIKE INCLUDING SUBSTRATE-ADHESION DETECTION AND ADHESION CORRECTION

FIELD OF THE INVENTION

This invention pertains to microlithography (transfer of a pattern, defined on a reticle or mask, onto a sensitive substrate). Microlithography is a key technology used in the fabrication of semiconductor integrated circuits, displays, micromachines, and the like. More specifically, the invention pertains to devices (termed "wafer chucks"), to which the substrate ("wafer") is mounted, that hold and move the substrate during microlithographic exposure. Even more specifically, the invention pertains to wafer chucks and related substrate-holding devices operable to correct instances of insufficient adhesion of the substrate to the substrate-holding device.

BACKGROUND OF THE INVENTION

During microlithographic exposure of a sensitive substrate ("wafer") the wafer typically is mounted to and held by a "wafer chuck." Microlithography performed using a charged particle beam must be performed in a subatmospheric pressure ("vacuum") environment; hence, the wafer chuck must be capable of holding the wafer in such an environment. Most conventional wafer chucks intended for use in a vacuum environment are configured to hold the wafer using electrostatic force. The surface of the wafer chuck to which the wafer (i.e., the downstream-facing surface of the wafer) is mounted is termed the "adhesion surface" of the wafer chuck.

During exposure of a wafer using a charged particle beam, the exposure beam is incident with high energy on the "sensitive" surface (upstream-facing resist-coated surface) of the wafer. Consequently, the wafer tends to experience heating, which can cause undesired thermal expansion of the wafer. Thermal expansion of the wafer can degrade the accuracy with which a pattern is transferred to the sensitive surface. Under extreme circumstances of wafer heating, the wafer can detach from or shift position on the adhesion surface.

A conventional method of reducing wafer heating is to configure the adhesion surface with grooves or channels that open onto the adhesion surface and the downstream-facing surface of the wafer. A heat-transfer gas such as helium is conducted through the channels, whenever the wafer is mounted to the adhesion surface, to dissipate heat from the wafer and thus reduce thermal expansion of the wafer.

To ensure that the wafer remains attached to the adhesion surface as the heat-transfer gas is passed through the channels, the pressure of the heat-transfer gas passing through the channels is regulated. In other words, the pressure of the gas must be less than a pressure, opposing the electrostatic force, sufficient to detach the wafer from the adhesion surface. Meanwhile, parameters that determine the quantity of heat transferred from the wafer to the wafer chuck by the heat-transfer gas include the thermal conductance of the gas, the gas pressure, and the length of the channel(s) through which the gas passes. For example, if the gas pressure is sufficiently low that the mean free path of the gas molecules is longer than a transverse dimension of the channel, then the thermal conductivity of the heat-transfer gas increases nearly proportionally to the gas pressure. On the other hand, if the mean free path is shorter than a transverse dimension of the channel, then the thermal conductivity is not proportional to the gas pressure.

Because the wafer chuck normally is located in a subatmospheric pressure environment, as the pressure of the heat-transfer gas in the channel increases, adhesion of the wafer to the adhesion surface of the wafer chuck weakens. In the worst case, the wafer actually detaches from the wafer chuck. Hence, it is important to maintain the pressure of the heat-transfer gas in the channel below a threshold that otherwise would result in detachment of the wafer from the adhesion surface.

The mean free path of molecules of the heat-transfer gas is obtained from an estimate of the pressure of the heat-transfer gas. In view of this, it is desirable to configure the channel (in the adhesion surface and located between the wafer chuck and the downstream-facing surface of the wafer) to have transverse dimensions that are equal or nearly equal to the mean free path.

With a conventional electrostatic wafer chuck, after the chuck is charged electrostatically, the wafer is assumed to be adequately adhered to the adhesion surface and the flow of heat-transfer gas through the channel begins. But, if the wafer in fact is not adhered adequately to the wafer chuck, even if the pressure of the heat-transfer gas is regulated "normally," a substantial risk exists that the wafer will "float" and laterally shift position on the adhesion surface. Other adverse consequences are also possible, such as the wafer actually falling off the wafer chuck. If any of these adverse events occurs, then the vacuum inside the chamber enclosing the wafer chuck must be broken and the wafer removed by hand. Afterward, the process of re-establishing the vacuum in the chamber and re-mounting the wafer to the wafer chuck must be performed, which results in lengthy equipment down-time.

Other possible adverse conditions are the presence of particulate debris between the downstream-facing surface of the wafer and the adhesion surface as the wafer is resting on the adhesion surface, and poor planarity or flatness of the wafer itself. As noted above, the flow of heat-transfer gas into the channel is regulated to maintain a particular target pressure of the gas in the channel under normal conditions. But, either of the adverse conditions noted above essentially opens the channel and allows excess leakage of heat-transfer gas from the channel into the vacuum chamber.

SUMMARY OF THE INVENTION

In view of the disadvantages of conventional wafer chucks as summarized above, an object of the invention is to provide substrate-holding devices (generally termed herein "wafer chucks") configured to prevent insufficient adhesion of the wafer to the wafer chuck. Another object is to provide microlithography apparatus including such improved wafer chucks.

To such ends and according to a first aspect of the invention, substrate-holding devices are provided. An embodiment of such a device includes a wafer-chuck body that defines an adhesion surface and comprises an electrostatic electrode. The adhesion surface is configured to contact a downstream-facing surface of a substrate whenever the substrate is being held by the substrate-holding device by an electrostatic force generated by the electrode. The adhesion surface defines a channel that is configured, whenever the substrate is adhered to the adhesion surface by the electrostatic force, to provide a conduit for a heat-transfer gas. Hence, whenever the heat-transfer gas is flowing through the conduit, the gas contacts and removes heat from the downstream-facing surface of the substrate. The device also comprises a gas-supply system and a substrateadhesion-confirmation device. The gas-supply system is connected to the channel and configured to supply a flow of the heat-transfer gas to the channel. The substrate-adhesion-confirmation device is situated and configured to detect whether the substrate is adhered to the adhesion surface. The device also includes a controller connected to the substrate-adhesion-confirmation device and to the gas-supply system. The controller is configured to cause the gas-supply system to supply the flow of the heat-transfer gas to the channel after the substrate-adhesion-confirmation device has confirmed adhesion of the substrate to the adhesion surface.

By way of example, the substrate-adhesion-confirmation device can comprise a height gauge situated and configured to measure an elevation of the substrate. Alternatively, the substrate-adhesion-confirmation device can comprise multiple grounding pins each situated and configured to contact the substrate electrically in a manner whereby a contact resistance of the electrical contact varies with contact pressure exerted by the respective grounding pin on the substrate. In this latter configuration, a power supply is provided that is connected via an electrical circuit to the grounding pins. The device, utilizing the power supply, can be configured to provide the requisite confirmation by any of the following schemes: (1) grounding of the substrate via the grounding pins and measuring changes in contact resistance of the pins with changes in contact pressure of the substrate against the grounding pins; (2) impressing a voltage between any pair of grounding pins and measuring voltage changes with changes in contact pressure of the substrate against the grounding pins; and (3) flowing an electrical current between any two of the pins and measuring the current. In general, if the contact pressure of a pin against the downstream-facing surface changes, then the contact resistance between the pin and the substrate changes, leading to a corresponding change in, e.g., electrical current between any two pins. Also, since the substrate is grounded by the pins, charging of the substrate during irradiation by a charged particle beam can be prevented.

If a grounding pin is not actually contacting the downstream-facing surface of the substrate, then electrical current will not flow through the circuit including the pin. Thus, it can be checked readily whether a pin is contacting the downstream-facing surface firmly.

Hence, according to the invention, it is not simply presumed that the substrate is adhered properly to the holding device after the electrode is energized. Rather, a confirmation is made that the substrate is adhered properly to the holding device. If no confirmation is made, then heat-transfer gas is not delivered to the channel. Consequently, problems associated with poor wafer chucking are avoided.

The device also can include a substrate-alignment device situated and configured to maintain a predetermined alignment position of the substrate relative to the adhesion surface under conditions in which the substrate is not actually adhered to the adhesion surface. The substrate-alignment device can comprise multiple alignment pins situated around the adhesion surface and configured to contact a respective edge of the substrate if the substrate moves laterally relative to the adhesion surface.

Desirably, the alignment pins are made of a non-magnetic metal, and are attached to the wafer chuck around a perimeter of the adhesion surface. By making the alignment pins of a non-magnetic metal, a charged particle beam impinging on the substrate being held by the substrate-holding device is unaffected by extraneous magnetic fields that otherwise would be formed.

According to another aspect of the invention, methods are provided for holding a substrate to allow performing a process on a process surface of the substrate. In an embodiment of such a method, a wafer chuck is provided that comprises a chuck body, an electrostatic electrode, and an adhesion surface on the chuck body. The adhesion surface defines a channel configured, whenever the substrate is adhered to the adhesion surface, to provide a conduit for a heat-transfer gas that, when flowing through the conduit, contacts and removes heat from the downstream-facing surface of the substrate. The substrate is placed on the adhesion surface, and the electrode is energized to cause the electrode to generate an electrostatic force intended to attract the substrate toward the adhesion surface. A confirmation is made that the substrate is adhered to the adhesion surface. After making the confirmation, a flow of the heat-transfer gas through the channel is commenced.

In another method embodiment, a wafer chuck is provided that includes the components summarized above as well as a substrate-alignment device. The substrate-alignment device is situated relative to the chuck body and is configured to contact a respective edge of the substrate if the substrate moves laterally relative to the adhesion surface. The substrate is placed on the adhesion surface and the electrode is energized. A flow of the heat-transfer gas through the channel is commenced. Using the substrate-alignment device, respective edges of the substrate are contacted as required to prevent the substrate from laterally sliding off the adhesion surface as a result of the heat-transfer gas flowing through the channel.

The foregoing methods can be utilized in conjunction with a method for manufacturing a microelectronic device on a substrate. For example, the manufacturing method can be a microlithographic method.

Another embodiment of a substrate-holding device comprises a wafer chamber defining an interior space. A pump is connected to the wafer chamber and configured to evacuate the interior space to a predetermined vacuum level. A wafer-chuck is situated within the interior space. The wafer chuck defines an adhesion surface and comprises an electrostatic electrode. The adhesion surface is configured to contact a downstream-facing surface of a substrate whenever the substrate is being held by the substrate-holding device (by an electrostatic force generated by the electrode). The adhesion surface defines a channel configured, whenever the substrate is adhered to the adhesion surface by the electrostatic force, to provide a conduit for a heat-transfer gas that, when flowing through the conduit, contacts and removes heat from the downstream-facing surface of the substrate. The device includes a gas-inlet conduit connected to the channel and to a supply of the heat-transfer gas, wherein the gas-inlet conduit is configured to conduct the heat-transfer gas into the channel. The device includes a gas-evacuation conduit connected to the channel and to an evacuation pump, wherein the gas-evacuation conduit is configured to evacuate, as urged by the evacuation pump, the heat-transfer gas from the channel. The device includes a seal situated relative to the substrate, as held on the adhesion surface, and the channel.

The seal is configured at least to limit an amount of heat-transfer gas flowing from the channel to the interior space whenever the substrate is on the adhesion surface. The device includes a first pressure detector situated and configured to measure a vacuum level in the interior space, and a second pressure detector situated and configured to measure a pressure within the gas-inlet conduit. The device also includes a controller connected to the first and second pressure detectors, to the supply of heat-transfer gas, and to the evacuation pump. The controller is configured to regulate a flow rate of the heat-transfer gas though the gas-inlet conduit in response to a pressure, detected by the second pressure detector, within the gas-inlet conduit, and to regulate a flow rate of gas through the gas-evacuation conduit in response to a vacuum level in the interior space as detected by the first pressure detector.

The device summarized above also can include a third pressure detector connected to the gas-evacuation conduit and to the controller. With such a configuration, the controller is further configured to regulate the flow rate of heat-transfer gas through the gas-inlet conduit in response to a pressure, detected by the third pressure detector, in the gas-evacuation conduit.

According to another aspect of the invention, charged-particle-beam (CPB) microlithography apparatus are provided that include a CPB-optical system situated and configured to direct a charged particle beam to form an image on a surface of a substrate. The apparatus also include a vacuum chamber defining an interior space, a vacuum pump connected to the wafer chamber and configured to evacuate the interior space to a predetermined vacuum level, and a wafer chuck. The wafer chuck is situated within the interior space. The wafer chuck defines an adhesion surface and includes an electrostatic electrode as summarized above. The wafer chuck also includes a gas-inlet conduit, a gas-evacuation conduit, a seal, a first pressure detector, a second pressure detector, and a controller, all as summarized above.

In an embodiment, according to the invention, of a method for manufacturing a microelectronic device on a substrate, a method is included for holding the substrate to allow performing a process on a process surface of the substrate. In such a method, a vacuum environment is provided in which to hold the substrate while performing the process on the substrate. A predetermined vacuum level is established in the vacuum environment. In the vacuum environment a wafer chuck is provided that comprises a chuck body, an electrostatic electrode, an adhesion surface, and a seal as summarized above. The substrate is placed on the adhesion surface. The electrode is energized to cause the electrode to generate an electrostatic force intended to attract the substrate toward the adhesion surface. Heat-transfer gas is conducted at a first flow rate through a gas-inlet conduit to the channel. Heat-transfer gas is evacuated at a second flow rate from the channel through a gas-evacuation conduit. The vacuum level in the vacuum environment is detected to obtain respective data, and a gas pressure within the gas-inlet conduit is detected to obtain respective data. Responsive to this data, the first flow rate and the second flow rate are regulated.

If adhesion of the substrate to the adhesion surface is poor, then the leakage of heat-transfer gas from the channel into the vacuum environment is increased compared to when adhesion is good and proper. Hence, whenever adhesion is poor, less vacuum is detected in the vacuum environment. The second flow rate is controlled (in this instance increased) to return to high vacuum in the vacuum environment, desirably bringing the vacuum level to a target value. Thus, leakage of heat-transfer gas from the channel is compensated for. Meanwhile, the first flow rate also is controlled to bring the detected pressure in the gas-inlet conduit at least closer to (desirably at) the target value.

It is desirable to consider the pressure in the gas-evacuation conduit in the regulation of the flow rate in the gas-inlet conduit, so as to improve estimates of the pressure inside the channel.

The foregoing and additional features and advantages of the invention will be more readily apparent from the following detailed description, which proceeds with reference to the accompanying drawings.

BRIEF DESCRIPTION OF THE DRAWINGS

FIGS. 1(A)–1(B) are elevational views depicting a wafer chuck according to the first representative embodiment, comprising height gauges for confirming the adhesion condition of the wafer to the adhesion surface of the wafer chuck. FIG. 1(A) is an exaggerated depiction of a "warped" wafer placed on the adhesion surface. FIG. 1(B) shows the wafer of FIG. 1(A) after being attracted electrostatically to the adhesion surface in a manner resulting in the wafer being attached firmly to the wafer chuck.

FIG. 2 schematically depicts a wafer chamber (with wafer stage and wafer chuck) of a charged-particle-beam (CPB) microlithography apparatus comprising the wafer chuck of the first representative embodiment.

FIG. 3 depicts the general structure of an electrostatic wafer chuck according to the second representative embodiment of the invention.

FIG. 4(A) is a schematic elevational section showing a wafer adhered to the adhesion surface of the wafer chuck; FIG. 4(B) is a schematic elevational section showing a condition in which the pressure of the heat-transfer gas is excessive or the electrostatic force is insufficient, resulting in floating of the substrate relative to the wafer chuck; and FIG. 4(C) is a schematic plan view of the arrangement of alignment pins on the adhesion surface.

DETAILED DESCRIPTION

Figure 4A:
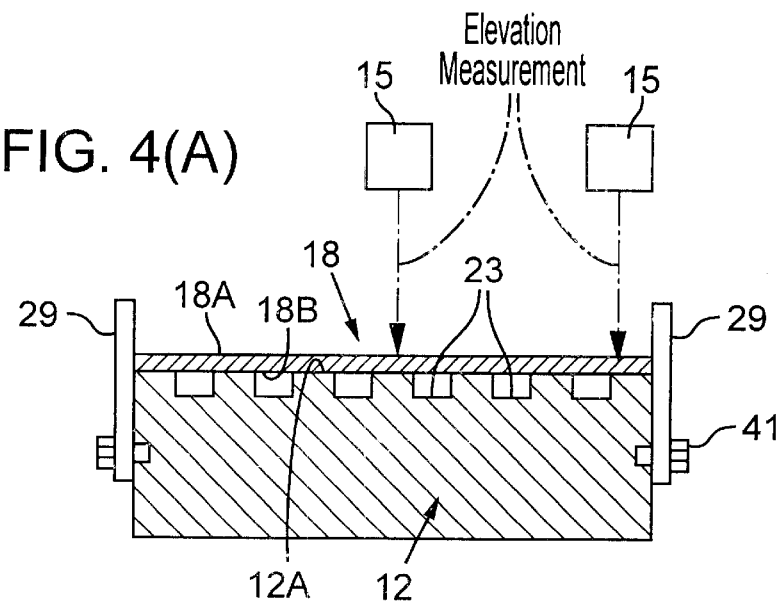
FIGS. 4(A)–4(C) depict enlarged views of the edges of the wafer chuck according to the third representative embodiment.

The invention is described below in the context of representative embodiments, which are not to be regarded as limiting in any way. The embodiments are described in the context of using an electron beam as a representative charged particle beam. However, it will be understood that the general principles described herein are applicable with equal facility to use of another type of charged particle beam, such as an ion beam. Also, although normally not used in an optical microlithography apparatus, (i.e., a microlithography apparatus employing light as an energy beam), this invention can be incorporated and used with ready facility in an optical microlithography apparatus.

First Representative Embodiment

This embodiment is shown in FIGS. 1(A)–1(B) and 2. More specifically, FIGS. 1(A)–1(B) depict a wafer chuck operable to confirm the condition of adhesion of a wafer to the adhesion surface of the wafer chuck using a height gauge; and FIG. 2 schematically depicts structure associated with the wafer chamber of a charged-particle-beam (CPB) microlithography apparatus including the wafer chuck shown in FIGS. 1(A)–1(B). In the following description, "top," "bottom," "left," and "right" correspond to top, bottom, left, and right, respectively, in FIGS. 1(A)–1(B) and 2.

Referring to FIG. 2, the CPB microlithography apparatus includes a wafer chamber 10, which is a vacuum chamber. The wafer chamber 10 encloses a wafer stage 11 and a wafer chuck 12 mounted on the wafer stage 11. The wafer stage 11 (with wafer chuck 12) is movable to and from an exposure position (left in the figure) and a wafer-exchange position (right in the figure). The wafer chamber 10 is connected to a vacuum-pump system 14 via a vacuum duct 13. During operation of the CPB microlithography apparatus, the pressure in the wafer chamber 10 is reduced to and maintained at a specified vacuum level by the vacuum-pump system 14. Extending from the wafer chamber 10 is a "lens column" 16 housing a CPB-optical system 16A and CPB source 17 of the CPB microlithography apparatus. "Above" the wafer-exchange position, multiple height gauges 15 extend, relative to the wafer chamber, toward a wafer 18 on the wafer chuck 12.

The CPB source 17 is situated at the "top" of the lens column 16. Whenever the wafer stage 11 is at the exposure position, the wafer 18 is situated "beneath" (downstream of) the lens column 16. Thus, the "process surface" 18A (upstream-facing surface typically coated with a layer of a suitable resist) of the wafer 18 can be irradiated by a charged particle beam CPB from the CPB source 17 and passing through the lens column 16. Exposure of the wafer 18 in this manner forms a desired pattern on the process surface 18A, as is well understood in the art.

A wafer-exchange door 20 is provided in the right-hand wall of the wafer chamber 10. The wafer-exchange door 20 thus defines a load-lock chamber 19 from which the wafer chamber can be isolated by the wafer-exchange door 20. The load-lock chamber 19 contains a robotic transporter (not shown, but well understood in the art) that delivers new wafers and exchanges new wafers for processed wafers through the wafer-exchange door 20. During wafer exchange, the wafer stage 11 is stopped at the wafer-exchange position near the wafer-exchange door 20.

The wafer stage 11 is movable, carrying the wafer chuck 12, right and left in the wafer chamber 10. The wafer chuck 12 comprises an adhesion surface 12A (upstream-facing surface) to which the wafer 18 is held by electrostatic force generated by the wafer chuck 12. To such end, electrodes 12B are situated below the adhesion surface 12A. The electrodes 12B are connected via electrical wiring 21 to an adhesion-control system 22. The adhesion-control system 22 causes the downstream-facing surface 18B of the wafer 18 either to adhere to or be released from the adhesion surface 12A by controlling the voltage supplied to the electrodes 12B.

Typically, a wafer 18 delivered into the wafer chamber 10 through the wafer-exchange door 20 is placed on the adhesion surface 12A of the wafer chuck 12. An electrostatic force is generated between the wafer 18 and the wafer chuck 12 by controlled application of electrical power to the electrodes 12B by the adhesion-control system 22. The electrostatic force causes the wafer 18 to be attracted to and to adhere to the adhesion surface 12A.

Channels 23 are defined (e.g., by machining) in the adhesion surface 12A and extend "downward" into the mass of the wafer chuck 12. The channels 23 are connected via a gas duct 24 and gas-flow regulator 26 to a supply source 25 of a heat-transfer gas (typically helium). During microlithographic exposure of the wafer 18, heat-transfer gas is supplied through the gas duct 24 to the channels 23. During the exposure, when the wafer normally would undergo heating due to impingement of the charged particle beam, heat is dissipated from the wafer to the heat-transfer gas and from the heat-transfer gas to the wafer chuck 12. Thus, temperature increases of the wafer 18 are suppressed. This suppression of increases in wafer temperature controllably minimizes thermal expansion of the wafer 18 and maintains the accuracy by which the pattern is transferred to the process surface 18A of the wafer 18.

The height gauges 15 (desirably two are provided) desirably are situated on an "upper" wall of the wafer chamber above the wafer-exchange position. The height gauges 15 are separated from each other by a specified distance (e.g., approximately the radius of the wafer 18), as shown in FIG. 2. The height gauges 15 measure the elevation of the wafer 18 whenever the wafer stage 11 is in the wafer-exchange position "below" the height gauges 15. Specifically, one of the height gauges 15 measures the elevation of the center of the wafer 18 while the other of the height gauges 15 measures the elevation of the edge of the wafer 18. The height gauges 15 can have any of various configurations and/or operating principles, such as using laser light, suitable for determining elevation of the wafer 18.

The process of confirming proper adhesion of the wafer 18 to the wafer chuck 12 is explained with reference to FIGS. 1(A)–1(B). In the following discussion, numerical values are provided by way of example only and are not intended to be limiting in any way.

In FIG. 1(A), the wafer 18 exhibits a "warp" (departure in the vertical direction from planarity) of, e.g., 100 $\mu$m. Whenever such a wafer 18 is measured by the height gauges 15, a corresponding elevational difference will be detected at the center versus edge of the wafer 18. After completing electrostatic adhesion of the wafer 18 to the adhesion surface 12A of the wafer chuck 12, as shown in FIG. 1(B), the measurement variation ("error") from the center to the edge of the wafer 18 normally is reduced substantially, e.g., to about 0.1 $\mu$m. If the elevation of the adhered wafer 18 is measured by the height gauges 15, the respective measured elevations at the center and edge of the wafer 18 are nearly equal to each other.

In this example, if the difference in wafer elevation of the center versus the edge of the wafer 18 is greater than 0.3 $\mu$m, then a conclusion is reached that the wafer 18 is not adhered completely or properly to the adhesion surface 12A of the wafer chuck 12. Under such a condition, supply of the heat-transfer gas to the channels 23 is ceased and steps to achieve proper adhesion of the wafer 18 to the adhesion surface 12A are repeated. After repeating the steps to achieve proper wafer adhesion, the elevation of the wafer 18 is re-measured by the height gauges 15.

On the other hand, if the respective wafer elevations as measured at the center and edge of the wafer 18 are nearly equal to each other (e.g., if the measured difference in elevation from the center to the edge of the wafer is less than 0.3 $\mu$m), then a conclusion is reached that the wafer 18 is adhered properly to the adhesion surface 12A. In such an instance, the heat-transfer gas is introduced to the channels 23 to achieve heat dissipation from the wafer 18 to the wafer chuck 12. Elevational measurements of the wafer 18 by the height gauges 15 are repeated as required to confirm that the wafer 18 remains attached to the adhesion surface 12A after commencing flow of the heat-transfer gas.

Since the heat-transfer gas is introduced to the channels 23 only after confirming proper adhesion of the wafer 18 to the adhesion surface 12A of the wafer chuck 12, as discussed above, this embodiment is effective in preventing accidental leaking of heat-transfer gas from the channels 23.

The number of height gauges 15 is not limited to two. More detailed measurements of the elevational distribution of the wafer 18 can be obtained by using more than two height gauges 15.

Second Representative Embodiment

This embodiment is depicted in FIG. 3. In FIG. 3, components that are similar to respective components shown and discussed in the first representative embodiment have the same respective reference numerals and are not discussed further below. Also, in FIG. 3, the adhesion-control system and the system for supplying the heat-transfer gas (see FIG. 2) are not shown. In the following description, "top," "bottom," "left," and "right" correspond to top, bottom, left, and right, respectively, in FIG. 3.

The following discussion of the FIG.-3 embodiment is directed mainly to the wafer chuck 12. The wafer 18 is adhered to the adhesion surface 12A of the wafer chuck 12 or released from the adhesion surface 12A based on whether or not, respectively, voltage is supplied by the adhesion-control system 22 to the electrodes 12B (see FIG. 2). Multiple (at least two) grounding pins 30 extend "upward" from the edge of the adhesion surface 12A, such that the distal tip of each grounding pin 30 is at a higher elevation than the adhesion surface 12A. Whenever the wafer 18 is placed on the adhesion surface 12A of the wafer chuck 12, the distal tips of the grounding pins 30 contact the downstream-facing surface 18B of the wafer 18. The grounding pins 30 desirably have a spring bias in the "upward" direction against which the downstream-facing surface 18B of the wafer 18 is urged whenever the wafer 18 is adhered to the adhesion surface 12A.

Whenever the wafer 18 simply is resting on the adhesion surface 12A, the contact force applied to the grounding pins 30 solely by the mass of the wafer 18 is relatively small. Consequently, the contact resistance of the grounding pins 30 to the wafer 18 is relatively high. On the other hand, whenever the wafer 18 is attracted electrostatically to the adhesion surface 12A, the force with which the wafer 18 contacts the grounding pins 30 is relatively large. Consequently, the contact resistance of the grounding pins 30 to the wafer 18 is relatively low.

The grounding pins 30, wafer 18, and a DC power supply 31 form a series circuit 32 in which the negative pole of the DC power supply 31 is electrically grounded. The grounding pin 30 extending from the "right" edge (in the figure) of the adhesion surface 12A also is grounded. In contrast, the grounding pin 30 extending from the left edge (in the figure) of the adhesion surface 12A has an electrical potential (supplied by the DC power supply 31) that is higher (by a specified magnitude) than the potential of the right-hand grounding pin 30. Since the contact resistance of each grounding pin 30 to the wafer is relatively low in the series circuit 32 whenever the wafer 18, placed on the adhesion surface 12A, is attracted electrostatically to the adhesion surface 12A, the current flowing through the series circuit 32 is relatively high under such conditions.

A current/voltage converter 33 is connected between the "left" grounding pin 30 and the DC power supply 31. The current flowing through the series circuit 32 is converted to a respective voltage by the current/voltage converter 33. The respective voltage is output to a gauge 34. The gauge 34 allows confirmation of whether the wafer 18 is adhered properly to the adhesion surface 12A of the wafer chuck 12.

If at least one of the grounding pins 30 is not actually contacting the downstream-facing surface 18B of the wafer 18, then no voltage will be output from the current/voltage converter 33 to the gauge 34 because the series circuit 32 is not complete. Hence, with this embodiment, it is easy to confirm whether the downstream-facing surface 18B of the wafer 18 is contacting each of the grounding pins 30 securely.

The heat-transfer gas is introduced into the channels 23 in the adhesion surface 12A of the wafer chuck 12 after confirming proper adhesion of the wafer 18 to the wafer chuck 12. Consequently, gas-leakage problems accompanying poor wafer chucking are prevented.

Third Representative Embodiment

Figure 4B:
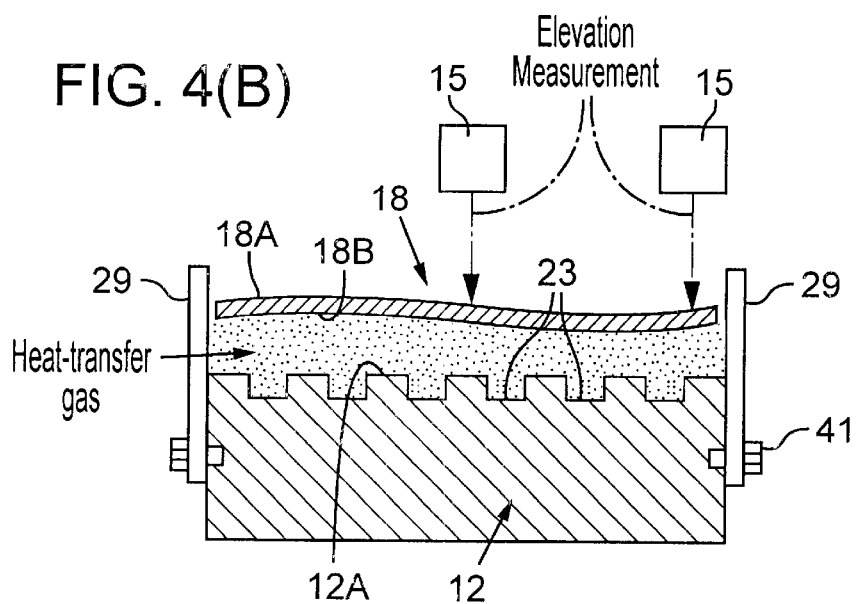
Figure 4C:
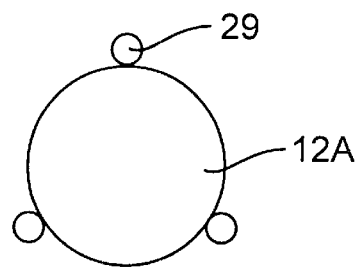

This embodiment is described with reference to FIGS. 4(A)–4(C). In FIGS. 4(A)–4(C), components that are similar to respective components shown and discussed in the first representative embodiment have the same respective reference numerals and are not discussed further below.

FIG. 4(A) is a schematic elevational section of a wafer 18 adhered to the wafer chuck 12. FIG. 4(B) is a schematic elevational section of a condition in which the pressure of the heat-transfer gas in the channels 23 is excessive or the electrostatic force between the wafer 18 and wafer chuck 12 is insufficient, causing the wafer 18 to "float" on the heat-transfer gas relative to the wafer chuck 12. FIG. 4(C) is a schematic plan view showing an exemplary arrangement of alignment pins 29 relative to the adhesion surface 12A of the wafer chuck 12.

The alignment pins 29 serve to prevent lateral shift of the wafer 18 relative to the adhesion surface 12A. In this embodiment, the alignment pins 29 are mounted to the sides of the wafer chuck 12 using bolts 41. Any of various other modes of attachment of the alignment pins 29 to the wafer chuck 12 can be utilized. In this embodiment, by way of example, three alignment pins 29 are situated equi-angularly around the circumference of the wafer chuck 12, as shown in FIG. 4(C). The alignment pins 29 desirably are made of a non-magnetic metal (e.g., copper or titanium) so as not to disturb the magnetic field around the wafer chuck 12.

By way of example, and not intending to be limiting in any way, with a wafer thickness of 1 mm, the distal ("top") end of each alignment pin 29 is about 2–3 mm above the adhesion surface 12A of the wafer chuck 12. The gap between the inside edge of each alignment pin 29 and the outer edge of the wafer 18 is, e.g., 0.2–0.5 mm. Desirably, the alignment pins 29 do not actually contact the wafer 18.

In FIG. 4(A), the wafer 18 is shown as normally adhered electrostatically to the adhesion surface 12A. In FIG. 4(B), in contrast, the electrostatic force between the wafer 18 and the wafer chuck 12 is insufficient relative to the pressure of heat-transfer gas in the channels 23, causing the wafer 18 to float on a cushion of the heat-transfer gas. Under such a condition, the alignment pins 29 prevent the wafer from laterally shifting and falling off the wafer chuck 12.

Therefore, according to this embodiment, the substrate (wafer) to be processed is prevented from laterally shifting and/or falling off the wafer chuck, if separated from the wafer chuck, and falling off the wafer chuck.

Fourth Representative Embodiment

Figure 5:
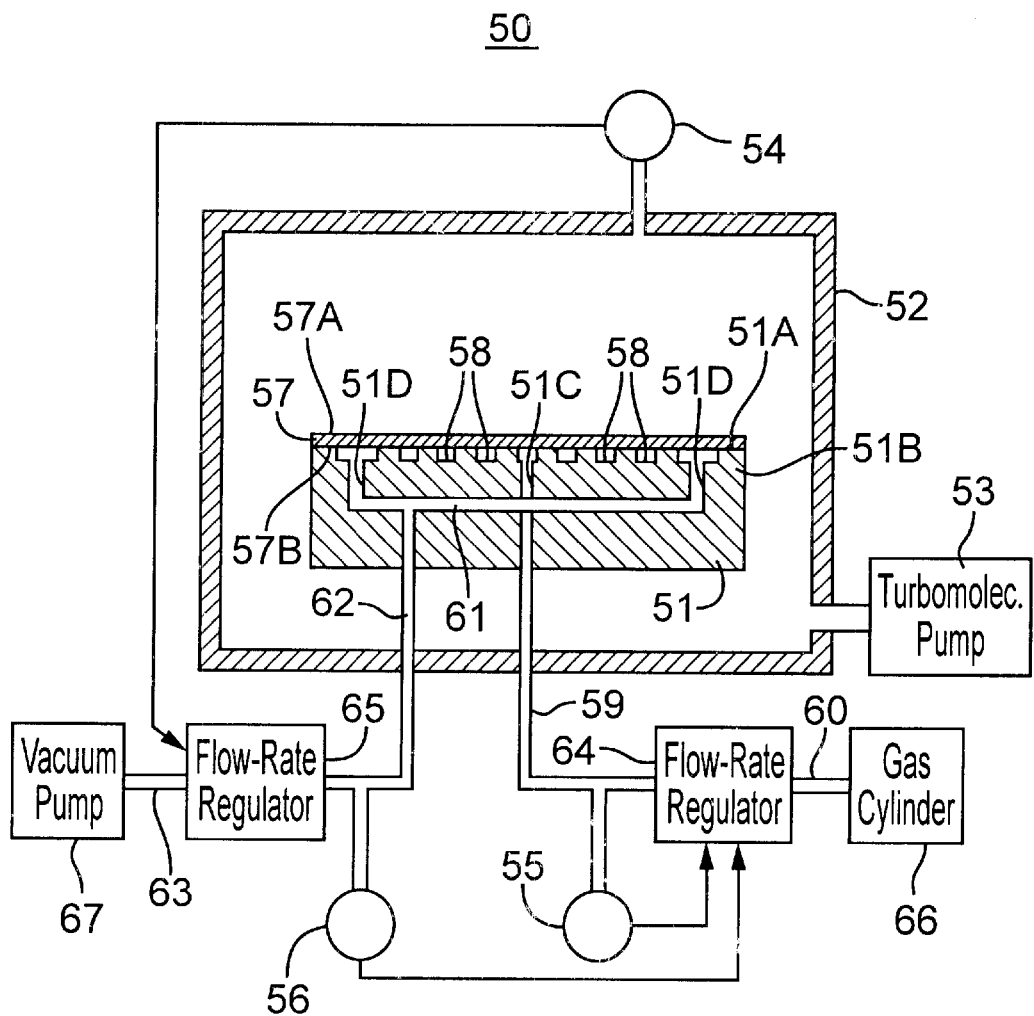
FIG. 5 schematically depicts the overall structure of the wafer chamber and wafer chuck in the fourth representative embodiment of the invention.

This embodiment is described with reference to FIG. 5, schematically depicting (in elevational section) a wafer chamber 52, a wafer chuck 51, and a wafer 57. Peripheral components are shown as a fluid-conduit system.

The wafer chamber 52 and other components shown in FIG. 5 are part of a wafer-processing apparatus 50. For example, the wafer-processing apparatus 50 can be a CPB microlithography apparatus, in which the downstream-facing surface 57B of the wafer 57 is adhered to the adhesion surface 51A of the wafer chuck 51 and a pattern is transferred microlithographically to the process surface 57A of the wafer 57. The wafer chuck 51 is situated inside the wafer chamber 52. A turbomolecular pump 53 (as an exemplary vacuum pump) is connected to the wafer chamber 52. The interior of the wafer chamber 52 is maintained at a high vacuum (about $1.0 \times 10^{-4}$ Pa) by the turbomolecular pump 53. A vacuum gauge 54 is connected to the wafer chamber 52 and is used to monitor the vacuum level inside the wafer chamber 52. The vacuum level detected by the vacuum gauge 54 is routed back to a flow-rate regulator 65, described below.

Channels 58 are defined in the adhesion surface 51A of the wafer chuck 51, except at the rim (seal) 51B of the adhesion surface. The channels 58 are interconnected or at least contiguous with each other. The rim (seal) 51B serves to suppress leakage of heat-transfer gas from the channels 58 into the wafer chamber 52. A gas-inlet port 51C passes vertically through the wafer chuck 51 and opens into a channel in the center of the adhesion surface 51A. A gas-inlet duct 59 is connected to the gas-inlet port 51C. Heat-transfer gas (e.g., helium gas) is introduced through the gas-inlet duct 59 to fill the channels 58 with the gas.

Representative parameters used for determining thermal conductivity between the wafer chuck 51 and the wafer 57 include the thermal conductivity and pressure of the heat-transfer gas filling the channels 58 as well as the transverse area and profile of the channels 58. The numerical density of atoms of the heat-transfer gas in the channels 58 is relatively low whenever the pressure of the heat-transfer gas in the channels is low. As a result, the mean free path of the gas atoms (i.e., the average distance that the atoms of gas can travel in a straight line) is significantly longer than a transverse dimension of the channel 58. Under such conditions, the thermal conductivity of the heat-transfer gas filling the channels 58 is nearly proportional to the pressure of the gas.

In contrast, the numerical density of atoms of the heat-transfer gas in the channels 58 is relatively large whenever the pressure of the heat-transfer gas in the channels 58 is high. As a result, the mean free path of the gas atoms is significantly shorter than a transverse dimension of the channel 58. Under such conditions, the thermal conductivity of the heat-transfer gas filling the channels 58 is constant, and is not dependent on the pressure of the heat-transfer gas.

The gas-inlet duct 59 originates at a flow-rate regulator 64, which is connected via a gas-inlet duct 60 to a gas cylinder 66 containing a compressed supply of the heat-transfer gas. A vacuum gauge 55 are connected to the gas-inlet duct 59 for monitoring the pressure inside the gas-inlet duct 59. Data concerning the pressure detected by the vacuum gauge 55 is routed back to the flow-rate regulator 64; hence, the flow rate of the heat-transfer gas through the gas-inlet duct 59 is controlled by the flow-rate regulator 64. Further detail concerning this control is provided below.

One or more gas-evacuation ports 51D open into channels 58 located near the rim 51B of the adhesion surface 51A. The gas-evacuation ports 51D extend through the wafer chuck 51 and are connected to a gas-evacuation conduit 61 that conducts the heat-transfer gas from the channels 58. To evacuate the heat-transfer gas, the gas-evacuation conduit 61 is connected to a gas-evacuation duct 62 connected via a flow-rate regulator 65 and a gas-discharge duct 63 to a vacuum pump 67. The flow rate of the heat-transfer gas in the gas-discharge duct 63 is controlled by the flow-rate regulator 65. Further detail concerning this control is provided below.

A vacuum gauge 56 is connected to the gas-evacuation duct 62 to monitor the pressure ("vacuum") inside the gas-evacuation conduit 61 and inside the gas-evacuation duct 62. Data concerning the pressure as measured by the vacuum gauge 56 are routed back to the flow-rate regulator 64. In this embodiment, the pressure inside the channels 58 is estimated based on the pressure data obtained by the vacuum gauges 55, 56. Whereas it is possible to consider only data from the vacuum gauge 55 in making such estimates, it is desirable to consider also the data from the vacuum gauge 56.

Flow control by the flow-rate regulators 64, 65 is achieved as follows. Whenever the condition of the downstream-facing surface 57B of the wafer 57 is good (e.g., not warped and free of contaminant particles attached to the downstream-facing surface), leakage of heat-transfer gas from the channels 58 into the wafer chamber 52 can be controlled adequately by the rim (seal) 51B of the wafer chuck 51. Under such conditions, the leak rate of heat-transfer gas is within the evacuation-capacity range of the turbomolecular pump 53. Consequently, a high vacuum (about $1 \times 10^{-4}$ Pa) can be maintained inside the wafer chamber 52 by the turbomolecular pump 53 alone. Also, whenever the condition of the downstream-facing surface 57B of the wafer 57 is good, the flow rate of heat-transfer gas in the gas-inlet duct 59 is controlled by the flow-rate regulator 64, and the flow rate of heat-transfer gas in the gas-evacuation duct 62 is controlled by the flow-rate regulator 65, so as to maintain the pressure inside the channel 58 at a target value (e.g., $2.7 \times 10^2$ Pa to $1.3 \times 10^3$ Pa (2 Torr to 10 Torr) for helium). Such control ensures good thermal conductivity between the wafer chuck 51 and the wafer 57, thereby providing good suppression of thermal expansion and deformation of the wafer.

On the other hand, if the condition of the downstream-facing surface 57B of the wafer 57 is poor, then a substantially increased leakage of heat-transfer gas from the rim (seal) 51B of the chuck 51 would be expected. Under such conditions, the leak rate of heat-transfer gas into the wafer chamber 52 would exceed the evacuation capacity of the turbomolecular pump 53. In extreme cases, the required high vacuum inside the wafer chamber 52 cannot be maintained by the turbomolecular pump 53 alone. Also, whenever the condition of the downstream-facing surface 57B is poor, the flow rate of heat-transfer gas in the gas-evacuation conduit 61 and the gas-evacuation duct 62 is controlled by the flow-rate regulator 65, so as to cause the interior of the wafer chamber 52 to return to a high vacuum (about $1.3 \times 10^{-3}$ Pa). Since the amount of heat-transfer gas evacuated from the channels 58 is increased by such a scheme, excessive leakage of the heat-transfer gas into the wafer chamber 52 from the channels 58 is suppressed.

Incidentally, if the amount of heat-transfer gas evacuated from the channels 58 increases, then the pressure inside the channels 58 drops below the target value. Therefore, making full use of the capacity of the gas-evacuation conduit 61 and gas-evacuation duct 62, the amount of heat-transfer gas introduced into the gas-inlet duct 59 is controlled by the flow-rate regulator 64 whenever the condition of the downstream-facing surface 57B is poor. This keeps the thermal conductivity between the wafer chuck 51 and the wafer 57 within an acceptable tolerance. Even though initiation of this control scheme may be somewhat time-delayed, the delay can be accommodated until the pressure inside the channels 58 returns to the target value so that no adverse effect occurs on the thermal conductivity between the wafer chuck 51 and the wafer 57.

As a concrete example, assume the pressure inside the channels 58 is about $2.7 \times 10^2$ Pa whenever the channels 58 are filled with helium gas (as a representative heat-transfer gas). Assume also that the "height" (as a representative transverse dimension) of the channels 58 is 100 μm, that the mean free path of the helium atoms is 100 μm, and that the ambient temperature in the vicinity of the wafer chuck 51 is 300° K. If the condition of the downstream-facing surface 57B of the wafer 57 is poor, then the flow rate of helium gas in the gas-inlet duct 59 can be controlled by the flow-rate regulator 64 so that the pressure inside the channels 58 is about $1.3 \times 10^3$ Pa (10 Torr).

Fifth Representative Embodiment

Figure 6A:
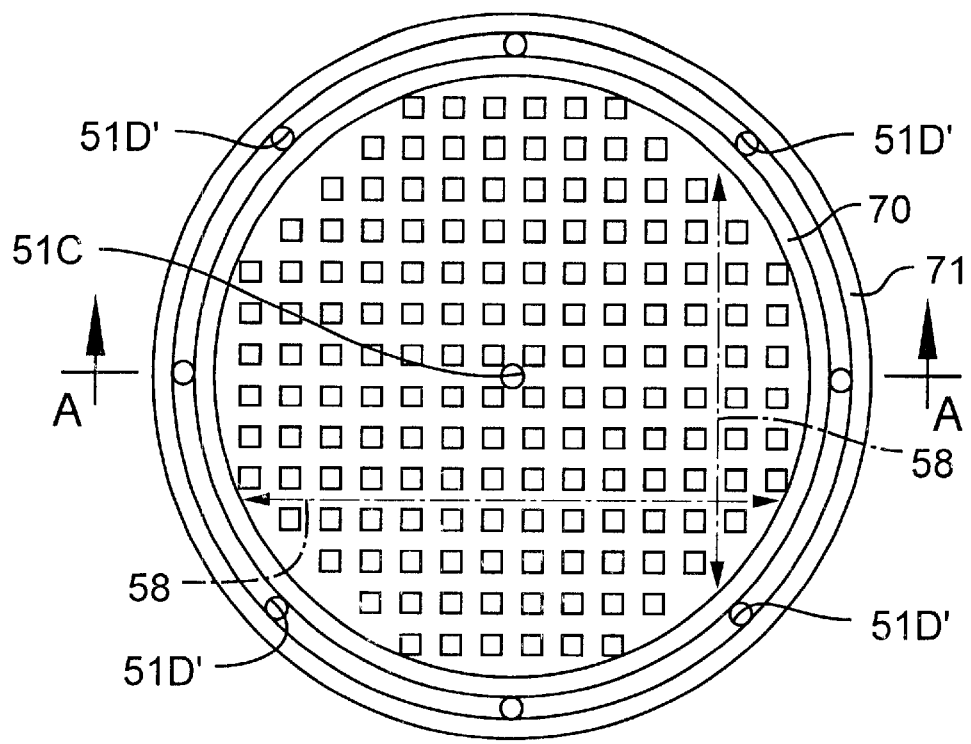
FIG. 6(A) is a plan view of a wafer chuck according to the fifth representative embodiment of the invention.
Figure 6B:
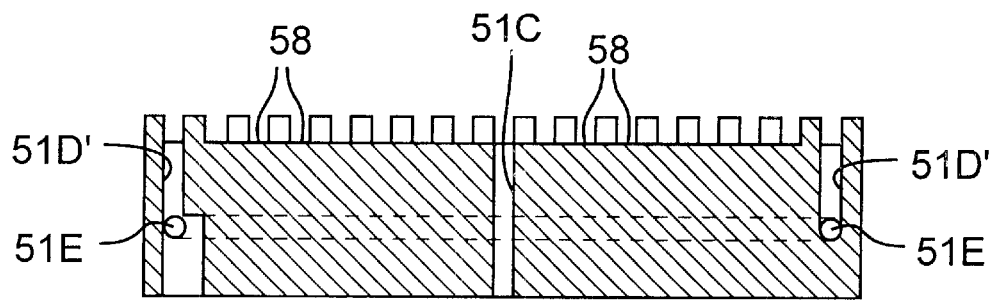
FIG. 6(B) is an elevational section along the line A—A in FIG. 6(A).

A wafer chuck according to this embodiment is shown in FIGS. 6(A)–6(B), wherein FIG. 6(A) is a plan view of the wafer chuck and FIG. 6(B) is an elevational section along the line A—A of FIG. 6(A). In FIGS. 6(A)–6(B), components that are similar to corresponding components in the fourth representative embodiment have the same respective reference numerals and are not described further below.

The wafer chuck of this embodiment comprises a first annular rim (seal) 70 and a second annular rim (seal) 71 situated radially "outside" the first annular rim 70 on the adhesion surface 51A of the wafer chuck 51. The annular rims 70, 71 perform the same function as the rim 51B in the fourth representative embodiment. By providing the double rim 70, 71 in the present embodiment, leakage of heat-transfer gas from the channels 58 into the wafer chamber 52 (see FIG. 5) can be controlled even better than in the fourth representative embodiment.

Multiple (e.g., eight) gas-evacuation ports 51D' are provided at uniform intervals in a circle in the space between the first annular rim 70 and second annular rim 71. The gas-evacuation ports 51D' perform the same function as the gas-evacuation ports 51D in the fourth representative embodiment. The gas-evacuation ports 51D' are connected to an annular channel 51E inside the body of the wafer chuck 51. Heat-transfer gas flowing through the channels 58 from the gas-inlet port 51C collects in the gas-evacuation ports 51D' and is evacuated. Since the thermal conductivity of the heat-transfer gas is increased by providing multiple gas-evacuation ports 51D', sudden pressure changes of heat-transfer gas in the channels 58 are ameliorated. Also, the target pressure of heat-transfer gas in the channels 58 can be set lower than in the fourth representative embodiment.

Although helium gas is the desired heat-transfer gas used in the representative embodiments described above, any of various other suitable gases can be used such as nitrogen. Of the various candidate heat-transfer gases, helium gas is inert and has better thermal conductivity than other candidate gases. Hence, helium is especially desirable for use as the heat-transfer gas.

Sixth Representative Embodiment

Figure 7:
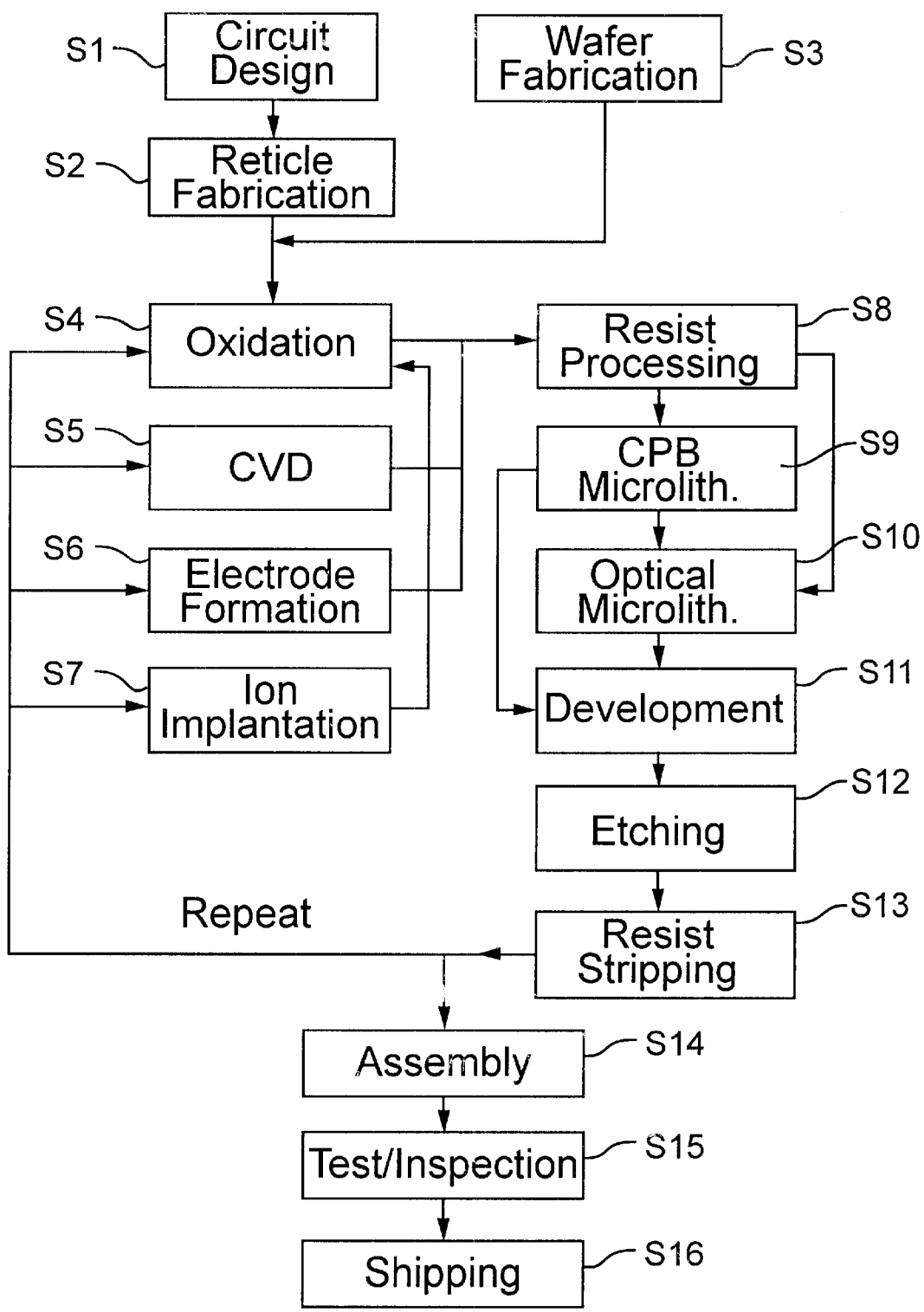
FIG. 7 is a flowchart of steps in a process for manufacturing a microelectronic device such as a semiconductor chip (e.g., integrated circuit or LSI), liquid-crystal panel, CCD, thin-film magnetic head, or micromachine, the process including performing microlithography using a microlithography apparatus according to the invention.

FIG. 7 is a flow chart of steps in a process for manufacturing a microelectronic device such as a semiconductor chip (e.g., an integrated circuit or LSI device), a display panel (e.g., liquid-crystal panel), charged-coupled device (CCD), thin-film magnetic head, micromachine, for example. In step 1, the circuit for the device is designed. In step 2, a reticle ("mask") for the circuit is manufactured. In step 2, local resizing of pattern elements can be performed to correct for proximity effects or space-charge effects during exposure. In step 3, a wafer is manufactured from a material such as silicon.

Steps 4–13 are directed to wafer-processing steps, specifically "pre-process" steps. In the pre-process steps, the circuit pattern defined on the reticle is transferred onto the wafer by microlithography. Step 14 is an assembly step (also termed a "post-process" step) in which the wafer that has been passed through steps 4–13 is formed into semiconductor chips. This step can include, e.g., assembling the devices (dicing and bonding) and packaging (encapsulation of individual chips). Step 15 is an inspection step in which any of various operability and qualification tests of the device produced in step 14 are conducted. Afterward, devices that successfully pass step 15 are finished, packaged, and shipped (step 16).

Steps 4–13 also provide representative details of wafer processing. Step 4 is an oxidation step for oxidizing the surface of a wafer. Step 5 involves chemical vapor deposition (CVD) for forming an insulating film on the wafer surface. Step 6 is an electrode-forming step for forming electrodes on the wafer (typically by vapor deposition). Step 7 is an ion-implantation step for implanting ions (e.g., dopant ions) into the wafer. Step 8 involves application of a resist (exposure-sensitive material) to the wafer. Step 9 involves microlithographically exposing the resist using a charged particle beam to as to imprint the resist with the reticle pattern. In step 9, a CPB microlithography apparatus as described above can be used. Step 10 involves microlithographically exposing the resist using optical microlithography. Step 11 involves developing the exposed resist on the wafer. Step 12 involves etching the wafer to remove material from areas where developed resist is absent. Step 13 involves resist separation, in which remaining resist on the wafer is removed after the etching step. By repeating steps 4–13 as required, circuit patterns as defined by successive reticles are formed superposedly on the wafer.

With any of the embodiments described above, since the heat-transfer gas is introduced into the channels in the adhesion surface of the wafer chuck always after confirming that the wafer has been adhered to the wafer chuck, problems accompanying poor wafer chucking are avoided.

In addition, as described above, the wafer to be processed is prevented from shifting laterally on the wafer chuck, separating from the wafer chuck, and falling off the wafer chuck, even when the wafer is floating relative to the wafer chuck on a cushion of heat-transfer gas.

Furthermore, since the flow rate with which heat-transfer gas is evacuated is regulated, if the condition of the downstream-facing surface of the wafer is poor such that the detected pressure in the wafer chamber approaches or exceeds a threshold value, leakage of heat-transfer gas from the channel between the wafer and the wafer chuck into the wafer chamber nevertheless can be suppressed adequately. If flow-rate control is performed in the gas inlet while taking into consideration the pressure in the gas-evacuation conduits, the pressure inside the channels can be estimated easily.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A substrate-holding device, comprising:
   a wafer-chuck body defining an adhesion surface and comprising an electrostatic electrode, the adhesion surface being configured to contact a downstream-facing surface of a substrate whenever the substrate is being held by the substrate-holding device by an electrostatic force generated by the electrode;

the adhesion surface defining a channel configured, whenever the substrate is adhered to the adhesion surface by the electrostatic force, to provide a conduit for a heat-transfer gas that, when flowing through the conduit, contacts and removes heat from the downstream-facing surface of the substrate;

a gas-supply system connected to the channel and configured to supply a flow of the heat-transfer gas to the channel;

a substrate-adhesion-confirmation device situated and configured to detect whether the substrate is adhered to the adhesion surface; and a controller connected to the substrate-adhesion-confirmation device and to the gas-supply system, the controller being configured to cause the gas-supply system to supply the flow of the heat-transfer gas to the channel after the substrate-adhesion-confirmation device has confirmed adhesion of the substrate to the adhesion surface.

2. The device of claim 1, wherein the substrate-adhesion-confirmation device comprises a height gauge situated and configured to measure an elevation of the substrate.

3. The device of claim 1, wherein the substrate-adhesion-confirmation device comprises:

multiple grounding pins each situated and configured to electrically contact the substrate in a manner whereby a contact resistance of the electrical contact varies with contact pressure exerted by the respective grounding pin on the substrate;

a power supply connected via an electrical circuit to the grounding pins and configured to apply a voltage between any two or more of the grounding pins; and an electrical-current-measuring device connected to the circuit and configured to measure an electrical current in the circuit, wherein the measured electrical current indicates whether the substrate is adhered to the adhesion surface.

4. The device of claim 1, further comprising a substrate-alignment device situated and configured to maintain a predetermined alignment position of the substrate relative to the adhesion surface under conditions in which the substrate is not actually adhered to the adhesion surface.

5. The device of claim 4, wherein the substrate-alignment device comprises multiple alignment pins situated around the adhesion surface and configured to contact a respective edge of the substrate if the substrate moves laterally relative to the adhesion surface.

6. The device of claim 5, wherein the alignment pins are made of a non-magnetic metal.

7. The device of claim 5, wherein the alignment pins are attached to the wafer chuck around a perimeter of the adhesion surface.

8. A substrate-holding device, comprising:

a wafer-chuck body defining an adhesion surface and comprising an electrostatic electrode, the adhesion surface being configured to contact a downstream-facing surface of a substrate whenever the substrate is being held by the substrate-holding device by an electrostatic force generated by the electrode;

the adhesion surface defining a channel configured, whenever the substrate is adhered to the adhesion surface by the electrostatic force, to provide a conduit for a heat-transfer gas that, when flowing through the conduit, contacts and removes heat from the downstream-facing surface of the substrate;

a gas-supply system connected to the channel and configured to supply a flow of the heat-transfer gas to the channel; and a substrate-alignment device situated and configured to maintain a predetermined alignment position of the substrate relative to the adhesion surface and to prevent the substrate from laterally shifting relative to the adhesion surface under conditions in which the heat-transfer gas is flowing in the conduit but the substrate is not actually adhered to the adhesion surface.

9. The device of claim 8, wherein the substrate-alignment device comprises multiple alignment pins situated around the adhesion surface and configured to contact a respective edge of the substrate if the substrate moves laterally relative to the adhesion surface.

10. The device of claim 9, wherein the alignment pins are made of a non-magnetic metal.

11. The device of claim 9, wherein the alignment pins are attached to the wafer chuck around a perimeter of the adhesion surface.

12. A method for holding a substrate to allow performing a process on a process surface of the substrate, comprising:

(a) providing a wafer chuck comprising a chuck body, an electrostatic electrode, an adhesion surface on the chuck body, and a substrate-alignment device, the adhesion surface defining a channel configured, whenever the substrate is adhered to the adhesion surface, to provide a conduit for a heat-transfer gas that, when flowing through the conduit, contacts and removes heat from the downstream-facing surface of the substrate, and the substrate-alignment device being situated relative to the chuck body and being configured to contact a respective edge of the substrate if the substrate moves laterally relative to the adhesion surface;

(b) placing the substrate on the adhesion surface;

(c) energizing the electrode to cause the electrode to generate an electrostatic force intended to attract the substrate toward the adhesion surface; and (d) commencing a flow of the heat-transfer gas through the channel and, using the substrate-alignment device, contacting respective edges of the substrate as required to prevent the substrate from laterally sliding off the adhesion surface as a result of the heat-transfer gas flowing through the channel.

13. In a method for manufacturing a microelectronic device on a substrate, a method for holding the substrate to allow performing a process on a process surface of the substrate, the method comprising:

(a) providing a wafer chuck comprising a chuck body, an electrostatic electrode, an adhesion surface on the chuck body, and a substrate-alignment device, the adhesion surface defining a channel configured, whenever the substrate is adhered to the adhesion surface, to provide a conduit for a heat-transfer gas that, when flowing through the conduit, contacts and removes heat from the downstream-facing surface of the substrate, and the substrate-alignment device being situated relative to the chuck body and being configured to contact a respective edge of the substrate if the substrate moves laterally relative to the adhesion surface;

(b) placing the substrate on the adhesion surface;

(c) energizing the electrode to cause the electrode to generate an electrostatic force intended to attract the substrate toward the adhesion surface; and (d) commencing a flow of the heat-transfer gas through the channel and, using the substrate-alignment device, contacting respective edges of the substrate as required to prevent the substrate from laterally sliding off the adhesion surface as a result of the heat-transfer gas flowing through the channel.

14. The method of claim 13, wherein the process performed on the substrate is a microlithography process.

15. A substrate-holding device, comprising:

a wafer chamber defining an interior space;

a pump connected to the wafer chamber and configured to evacuate the interior space to a predetermined vacuum level;

a wafer-chuck situated within the interior space, the wafer chuck defining an adhesion surface and comprising an electrostatic electrode, the adhesion surface being configured to contact a downstream-facing surface of a substrate whenever the substrate is being held by the substrate-holding device by an electrostatic force generated by the electrode;

the adhesion surface defining a channel configured, whenever the substrate is adhered to the adhesion surface by the electrostatic force, to provide a conduit for a heat-transfer gas that, when flowing through the conduit, contacts and removes heat from the downstream-facing surface of the substrate;

a gas-inlet conduit connected to the channel and to a supply of the heat-transfer gas, the gas-inlet conduit being configured to conduct the heat-transfer gas into the channel;

a gas-evacuation conduit connected to the channel and to an evacuation pump, the gas-evacuation conduit being configured to evacuate, as urged by the evacuation pump, the heat-transfer gas from the channel;

a seal situated relative to the substrate, as held on the adhesion surface, and the channel, the seal being configured at least to limit an amount of heat-transfer gas flowing from the channel to the interior space whenever the substrate is on the adhesion surface;

a first pressure detector situated and configured to measure a vacuum level in the interior space, and a second pressure detector situated and configured to measure a pressure within the gas-inlet conduit; and a controller connected to the first and second pressure detectors, to the supply of heat-transfer gas, and to the evacuation pump, the controller being configured to regulate a flow rate of the heat-transfer gas though the gas-inlet conduit in response to a pressure, detected by the second pressure detector, within the gas-inlet conduit, and to regulate a flow rate of gas through the gas-evacuation conduit in response to a vacuum level in the interior space as detected by the first pressure detector.

16. The substrate-holding device of claim 15, further comprising a third pressure detector connected to the gas-evacuation conduit and to the controller, the controller being further configured to regulate the flow rate of heat-transfer gas through the gas-inlet conduit in response to a pressure, detected by the third pressure detector, in the gas-evacuation conduit.

17. A charged-particle-beam (CPB) microlithography apparatus, comprising:

a CPB-optical system situated and configured to direct a charged particle beam to form an image on a surface of a substrate;

a vacuum chamber defining an interior space;

a vacuum pump connected to the wafer chamber and configured to evacuate the interior space to a predetermined vacuum level;

a wafer-chuck situated within the interior space, the wafer chuck defining an adhesion surface and comprising an electrostatic electrode, the adhesion surface being configured to contact a downstream-facing surface of a substrate whenever the substrate is being held by the substrate-holding device by an electrostatic force generated by the electrode;

the adhesion surface defining a channel configured, whenever the substrate is adhered to the adhesion surface by the electrostatic force, to provide a conduit for a heat-transfer gas that, when flowing through the conduit, contacts and removes heat from the downstream-facing surface of the substrate;

a gas-inlet conduit connected to the channel and to a supply of the heat-transfer gas, the gas-inlet conduit being configured to conduct the heat-transfer gas into the channel;

a gas-evacuation conduit connected to the channel and to an evacuation pump, the gas-evacuation conduit being configured to evacuate, as urged by the evacuation pump, the heat-transfer gas from the channel;

a seal situated relative to the substrate, as held on the adhesion surface, and the channel, the seal being configured at least to limit an amount of heat-transfer gas flowing from the channel to the interior space whenever the substrate is on the adhesion surface;

a first pressure detector situated and configured to measure a vacuum level in the interior space, and a second pressure detector situated and configured to measure a pressure within the gas-inlet conduit; and a controller connected to the first and second pressure detectors, to the supply of heat-transfer gas, and to the evacuation pump, the controller being configured to regulate a flow rate of the heat-transfer gas though the gas-inlet conduit in response to a pressure, detected by the second pressure detector, within the gas-inlet conduit, and to regulate a flow rate of gas through the gas-evacuation conduit in response to a vacuum level in the interior space as detected by the first pressure detector.

18. In a method for manufacturing a microelectronic device on a substrate, a method for holding the substrate to allow performing a process on a process surface of the substrate, the method comprising:

(a) providing a vacuum environment in which to hold the substrate while performing the process on the substrate;

(b) establishing a predetermined vacuum level in the vacuum environment;

(c) providing in the vacuum environment a wafer chuck comprising a chuck body, an electrostatic electrode, and an adhesion surface on the chuck body, the adhesion surface defining a channel configured, whenever a downstream-facing surface of the substrate is adhered to the adhesion surface, to provide a conduit for a heat-transfer gas that, when flowing through the conduit, contacts and removes heat from the downstream-facing surface of the substrate;

(d) placing the substrate on the adhesion surface;

(e) energizing the electrode to cause the electrode to generate an electrostatic force intended to attract the substrate toward the adhesion surface;

(f) conducting heat-transfer gas at a first flow rate through a gas-inlet conduit to the channel;

(g) evacuating heat-transfer gas at a second flow rate from the channel through a gas-evacuation conduit;

(h) providing a seal situated relative to the substrate, as held on the adhesion surface, and the channel, and configuring the seal at least to limit an amount of heat-transfer gas flowing from the channel to the vacuum environment whenever the substrate is on the adhesion surface;

(i) detecting the vacuum level in the vacuum environment to obtain respective data;

(j) detecting a gas pressure within the gas-inlet conduit to obtain respective data; and (k) responsive to data obtained in steps (i) and (j), regulating the first flow rate and the second flow rate, respectively.

19. A microlithography apparatus, comprising a substrate-holding device as recited in claim 1.

20. A microlithography apparatus, comprising a substrate-holding device as recited in claim 8.

21. A microlithography apparatus, comprising a substrate-holding device as recited in claim 15.

22. A microelectronic-device-fabrication process, comprising the steps:
(a) preparing a wafer;
(b) processing the wafer; and
(c) assembling devices formed on the wafer during steps (a) and (b), wherein step (b) comprises the steps of (i) applying a resist to the wafer; (ii) exposing the resist; and (iii) developing the resist; and step (ii) comprises providing a microlithography apparatus as recited in claim 19; and using the microlithography apparatus to expose the resist with the pattern defined on the reticle.

23. A microelectronic-device-fabrication process, comprising the steps:
(a) preparing a wafer;
(b) processing the wafer; and
(c) assembling devices formed on the wafer during steps (a) and (b), wherein step (b) comprises the steps of (i) applying a resist to the wafer; (ii) exposing the resist; and (iii) developing the resist; and step (ii) comprises providing a microlithography apparatus as recited in claim 20; and using the microlithography apparatus to expose the resist with the pattern defined on the reticle.

24. A microelectronic-device-fabrication process, comprising the steps:
(a) preparing a wafer;
(b) processing the wafer; and
(c) assembling devices formed on the wafer during steps (a) and (b), wherein step (b) comprises the steps of (i) applying a resist to the wafer; (ii) exposing the resist; and (iii) developing the resist; and step (ii) comprises providing a microlithography apparatus as recited in claim 21; and using the microlithography apparatus to expose the resist with the pattern defined on the reticle.

25. A microelectronic-device-fabrication process, comprising the steps:
(a) preparing a wafer;
(b) processing the wafer; and
(c) assembling devices formed on the wafer during steps (a) and (b), wherein step (b) comprises the steps of (i) applying a resist to the wafer; (ii) exposing the resist; and (iii) developing the resist; and step (ii) comprises providing a CPB microlithography apparatus as recited in claim 17; and using the CPB microlithography apparatus to expose the resist with the pattern defined on the reticle.

26. A microelectronic device produced by the process of claim 22.

27. A microelectronic device produced by the process of claim 23.

28. A microelectronic device produced by the process of claim 24.

29. A microelectronic device produced by the process of claim 25.

* * * * *

UNITED STATES PATENT AND TRADEMARK OFFICE
CERTIFICATE OF CORRECTION

PATENT NO.    : 6,570,752 B2
DATED         : May 27, 2003
INVENTOR(S)   : Morita et al.

It is certified that error appears in the above-identified patent and that said Letters Patent is hereby corrected as shown below:

Title page,
Item [56], OTHER PUBLICATIONS, "Sceince" should be -- Science --.

Column 5,
Line 3, "though" should be -- through --.

Signed and Sealed this

Eleventh Day of November, 2003

JAMES E. ROGAN
*Director of the United States Patent and Trademark Office*